United States Patent [19]
Inokuchi

[11] Patent Number: 5,872,369
[45] Date of Patent: Feb. 16, 1999

[54] SOLID-STATE ANTENNA SWITCH AND FIELD-EFFECT TRANSISTOR

[75] Inventor: Kazuyuki Inokuchi, Tokyo, Japan

[73] Assignee: Oki Electric Industry Co., Ltd., Tokyo, Japan

[21] Appl. No.: 791,845

[22] Filed: Jan. 30, 1997

[30] Foreign Application Priority Data

Feb. 21, 1996 [JP] Japan .................................. 8-033221

[51] Int. Cl.⁶ .............................. H01Q 1/00; H01Q 3/00; H04B 1/40
[52] U.S. Cl. .............................. 257/66; 257/262; 257/67; 257/47; 257/409; 257/401; 257/339; 327/581; 327/437; 327/389
[58] Field of Search ................................ 257/66, 47, 57, 257/262, 428, 429, 421, 339, 330, 347; 327/437, 581, 389

[56] References Cited

U.S. PATENT DOCUMENTS

| | | | |
|---|---|---|---|
| Re. 32,369 | 3/1987 | Stockton et al. .......................... | 341/368 |
| 4,669,062 | 5/1987 | Nakano ..................................... | 257/67 |
| 4,757,362 | 7/1988 | Biwa et al. .............................. | 257/408 |
| 4,894,114 | 1/1990 | Nathanson et al. ...................... | 156/631 |
| 4,947,232 | 8/1990 | Ashida et al. ........................... | 257/336 |
| 5,308,999 | 5/1994 | Gotou ........................................ | 257/66 |
| 5,428,238 | 6/1995 | Hayashi et al. .......................... | 257/67 |
| 5,585,288 | 12/1996 | Davis et al. .............................. | 437/38 |
| 5,693,961 | 12/1997 | Hamada ................................... | 257/66 |
| 5,705,940 | 1/1998 | Newman et al. ........................ | 327/541 |

OTHER PUBLICATIONS

"High Power DPDT Antenna Switch MMIC for Digital Cellular Systems", Kohama et al, GaAs IC Symposium Digest, IEEE, 1995, pp. 75–79.

*Primary Examiner*—Tom Thomas
*Assistant Examiner*—Alexander Oscar Williams
*Attorney, Agent, or Firm*—Venable; Robert J. Frank; Catherine M. Voorhees

[57] ABSTRACT

A field-effect transistor has a covering electrode overlying at least part of the transistor's channel. The covering electrode is formed on an insulating layer that covers the source, gate, and drain of the transistor. One voltage is applied to the covering electrode when the field-effect transistor is switched on. Another voltage is applied when the field-effect transistor is switched off, creating an electric field that hinders current flow in the channel. In an antenna switch, this type of transistor couples an antenna to a receiving circuit, and another transistor couples the antenna to a transmitting circuit.

16 Claims, 6 Drawing Sheets

SOLID-STATE ANTENNA SWITCH AND FIELD-EFFECT TRANSISTOR

BACKGROUND OF THE INVENTION

The present invention relates to a solid-state switch for selectively coupling an antenna to transmitting and receiving circuits, and to a type of field-effect transistor useful in this switch and other switches.

The antennas of time-division multiple-access (TDMA) digital wireless telephone sets, for example, must be switched rapidly between transmitting and receiving functions. Solid-state switches comprising diodes or transistors are commonly employed, as electromechanical switches would be too slow. In particular, a bridge network of field-effect transistors can be used as an antenna switch. The network acts as a double-pole double-throw (DPDT) switch, coupling the transmitting and receiving circuits alternately to the antenna and to ground.

To avoid loss of transmitting power, and to provide adequate coupling to ground, the field-effect, transistors in such a switch must have a low resistance in the on-state. To prevent leakage of transmitted signals into the receiving circuit, however, the transistors also need to have a very high resistance in the off-state. These are conflicting requirements, since a low on-resistance comes from a short channel, while a high off-resistance normally demands a long channel. To isolate receiving and control circuits from the high power output by the transmitter, the transistors must also have high source-drain and gate-drain breakdown voltages, but this too normally requires a long channel, which is incompatible with a low on-resistance.

SUMMARY OF THE INVENTION

It is accordingly an object of the present invention to provide a solid-state antenna switch that combines low-resistance coupling with good isolation.

Another object of the invention is to provide a field-effect transistor combining a low on-resistance with a high source-drain breakdown voltage.

Yet another object is to provide a field-effect transistor combining a low on-resistance with a high gate-drain breakdown voltage.

The invented field-effect transistor has a semiconductor substrate, source, channel, drain, source electrode, gate electrode, and drain electrode as in conventional field-effect transistors. All of these elements are covered by an insulating layer, also as in conventional field-effect transistors. A covering electrode is formed on the insulating layer, overlying at least part of the channel between the gate electrode and drain. One voltage is applied to the covering electrode when the field-effect transistor is switched on, and another voltage is applied when the field-effect transistor is switched off. The voltage applied in the off-state creates an electric field that hinders current flow in the channel.

The invented antenna switch has a first field-effect transistor that couples an antenna to a receiving circuit, and a second field-effect transistor that couples the antenna to a transmitting circuit. The first field-effect transistor is of the invented type.

DETAILED DESCRIPTION OF THE INVENTION

Embodiments of the invention will be described below with reference to the drawings. Embodiments of the invented field-effect transistor will be described first, followed by an embodiment of the invented antenna switch.

Figure 1:
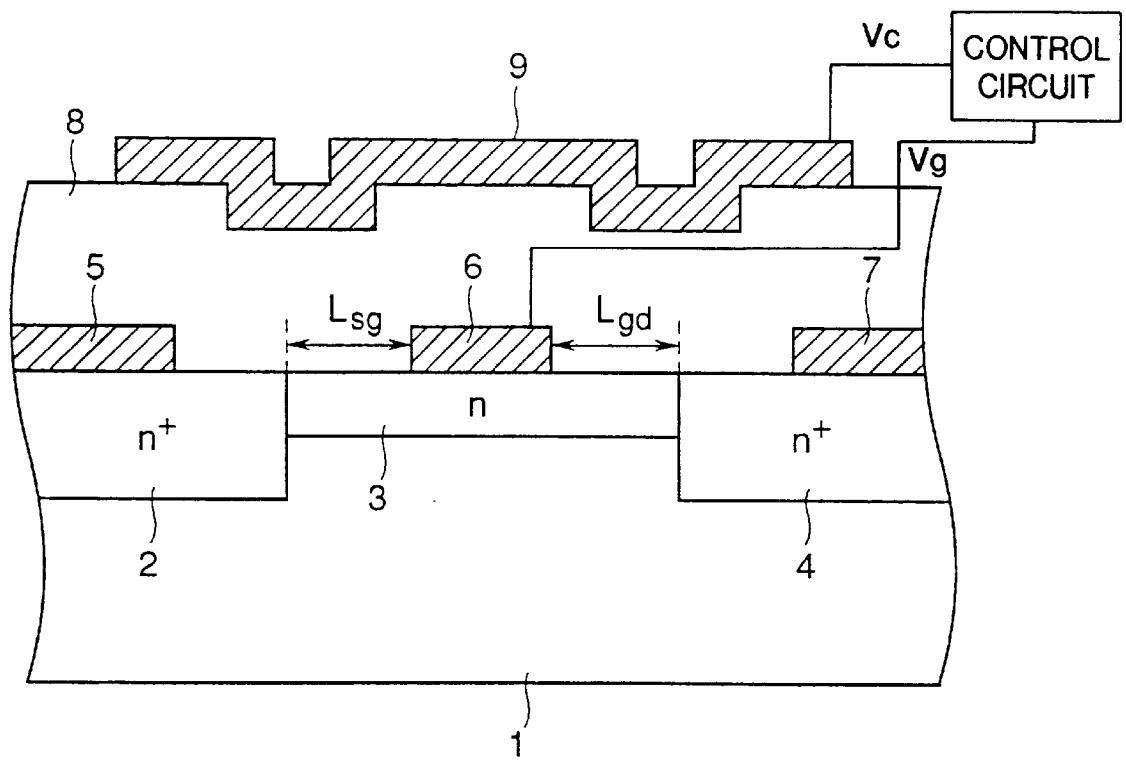
FIG. 1 is a sectional view of a first embodiment of the invented field-effect transistor.

Referring to FIG. 1, the first embodiment is a field-effect transistor comprising a gallium-arsenide (GaAs) substrate 1, a source n$^+$ region 2, a channel 3, a drain n$^+$ region 4, a source electrode 5, a gate electrode 6, a drain electrode 7, an insulating layer 8, and a novel covering electrode 9. The distance $L_{sg}$ from the source region 2 to the gate electrode 6 and the distance $L_{gd}$ from the gate electrode 6 to the drain region 4 are both equal to one micrometer (1 μm).

The insulating layer 8 in FIG. 1 is a silicon-nitride (SiN) layer approximately one thousand angstroms (1000 Å) thick. The novel covering electrode 9 is a patterned metal film comprising titanium, platinum, gold, or an alloy thereof. The covering electrode 9 overlies the entire channel 3 and extends even farther, from a point over the source electrode 5 to a point over the drain electrode 7.

The gate electrode 6 and covering electrode 9 have respective contact points for connection to an external control circuit, which can apply a gate voltage $V_g$ to the gate electrode 6, and a control voltage $V_c$ to the covering electrode 9. The source and drain electrodes 5 and 7 also have contact points (not, shown) for connection to external circuits.

When the transistor is switched on by application of a positive gate voltage $V_g$, a positive control voltage $V_c$ is also applied to the covering electrode 9. The electric field created by the positive voltages at the gate electrode 6 and covering electrode 9 draws carriers (in this case electrons) into the channel 3, so that current can flow between the source and drain regions 2 and 4.

When the transistor is switched off by application of a ground voltage or negative voltage to the gate electrode 6, a negative control voltage $V_c$ is applied to the covering electrode 9. The electric field created by the negative control voltage $V_c$ drives carriers (electrons) out of the channel 3, thus hindering the flow of current between the source and drain regions 2 and 4.

Figure 1A:
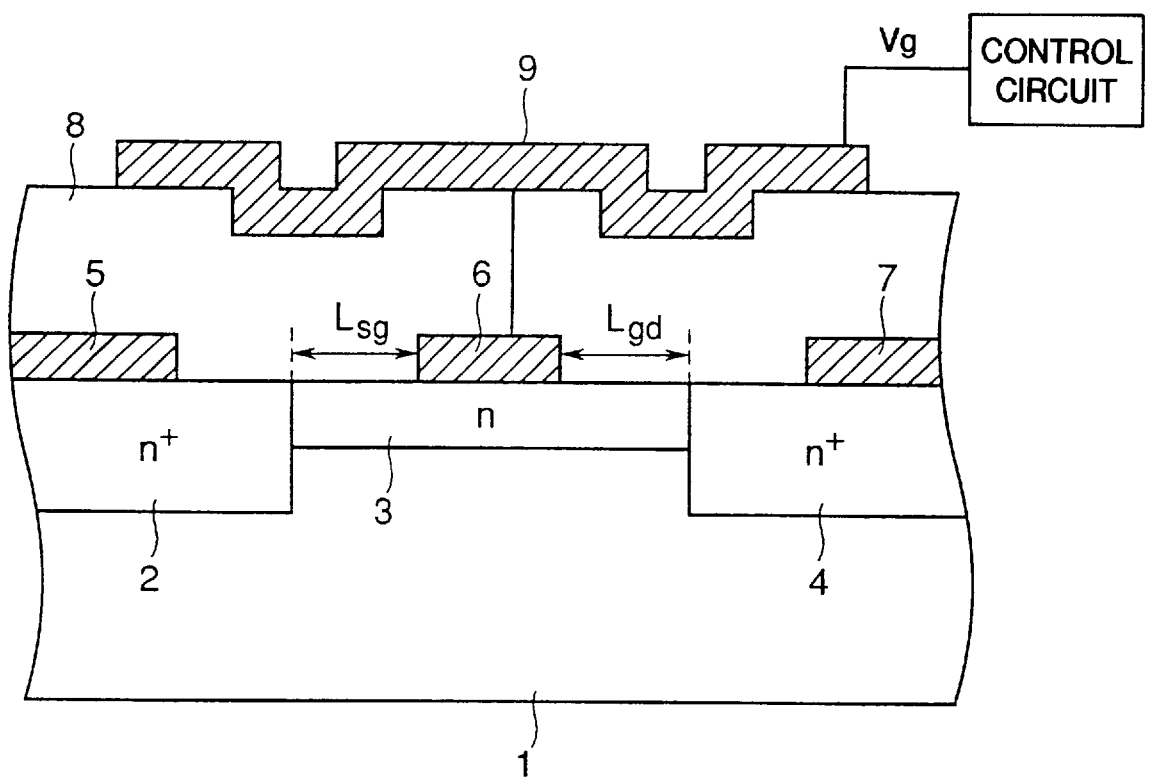
FIG. 1A shows a modification of the first embodiment.

In a variation of the first embodiment as shown in FIG. 1A, the gate electrode 6 and covering electrode 9 are internally interconnected, and the external control circuit applies a single gate voltage $V_g$ to both electrodes 6 and 9.

Figure 2:
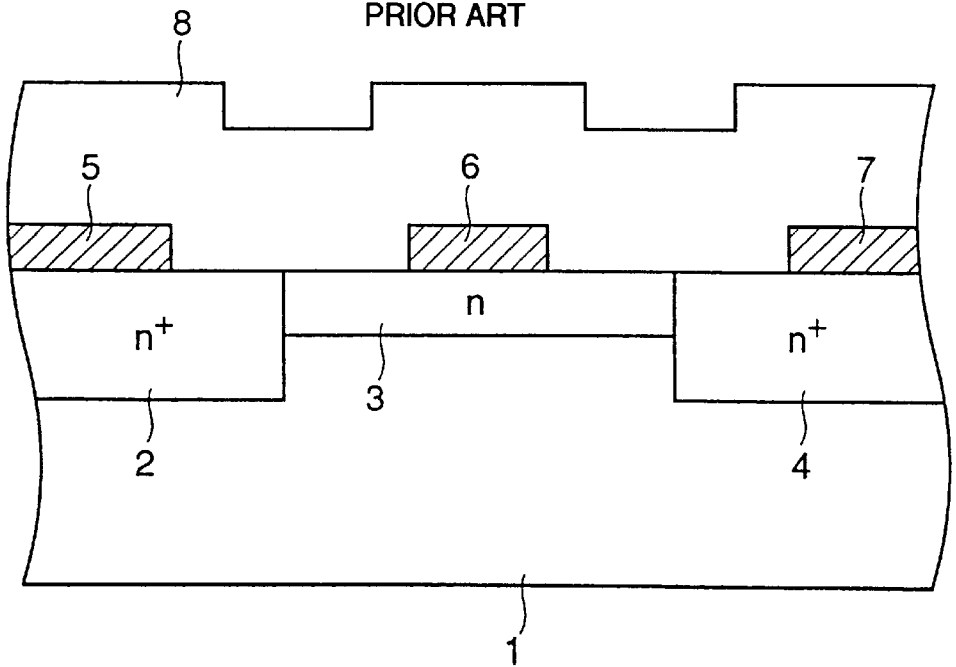
FIG. 2 is a sectional view of a conventional field-effect transistor.

For comparison, FIG. 2 shows a conventional field-effect transistor, using the same reference numerals as in FIG. 1. Except for the lack of a covering electrode, the conventional field-effect transistor is identical to the first embodiment. A detailed description of the individual elements of the conventional field-effect transistor in FIG. 2, and of the corresponding elements in FIG. 1, will be omitted.

The symmetry of the transistor in FIG. 1 makes the two $n^+$ regions 2 and 4 interchangeable: either region 2 or 4 can function as the source, and either as the drain. The same is true in FIG. 2. Symmetry is an advantage when the transistor is incorporated into an integrated circuit, as the circuit layout is simplified, often enabling the size of the integrated circuit to be reduced.

Figure 3:
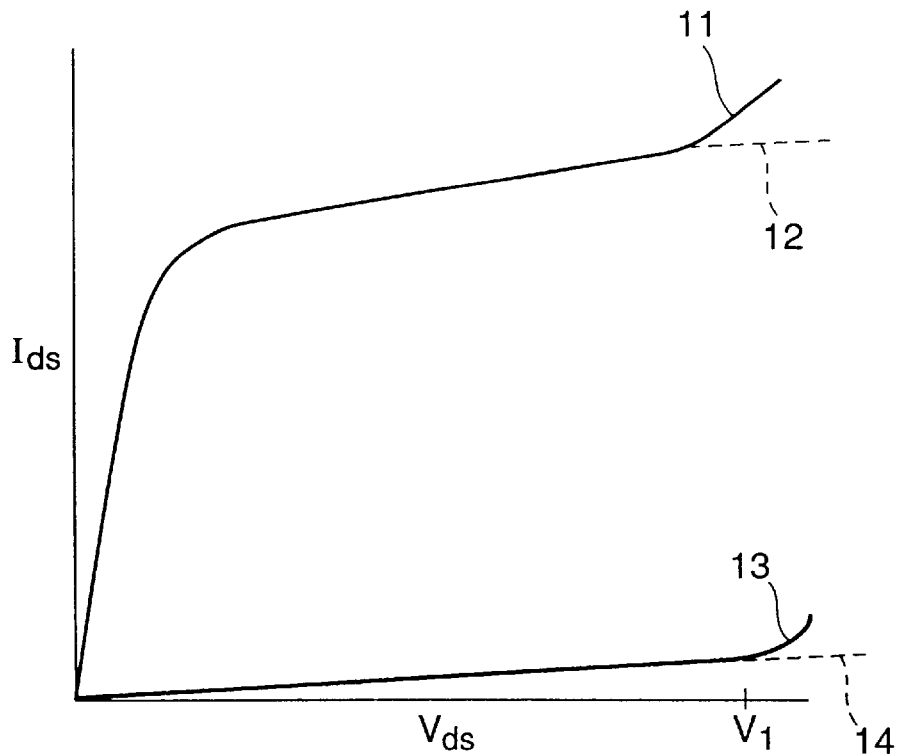
FIG. 3 illustrates source-drain current-voltage characteristics of the invented and conventional field-effect transistors.

FIG. 3 illustrates the relationship between source-drain voltage ($V_{ds}$), shown on the horizontal axis, and source-drain current ($I_{ds}$), shown on the vertical axis, in the symmetric transistors of FIGS. 1 and 2.

Solid line 11 characterizes the conventional transistor (FIG. 2) in the on-state. Dotted line 12 characterizes the first embodiment (FIG. 1) in the on-state, with the same positive voltage applied to both the gate electrode 6 and covering electrode 9. The on-resistance or the transistors can be determined from these characteristics 11 and 12.

Solid line 13 characterizes the conventional transistor in the off-state. Dotted line 14 characterizes the first embodiment in the off-state, with a control voltage $V_c$ of minus ten volts (–10 V) applied to the covering electrode 9. The off-state characteristics 13 and 14 are leakage characteristics, for ideally, no current should flow when the transistor is switched off.

As FIG. 3 shows, the source-drain voltage-current characteristics of the conventional transistor and the first embodiment are identical tip to a certain voltage $V_1$, at which point the conventional transistor begins to experience source-drain breakdown. The breakdown leads to a sharp rise in off-state leakage current in the conventional field-effect transistor. The first embodiment continues to maintain good source-drain isolation even above voltage $V_1$, allowing only a small leakage current to pass.

Figure 4:
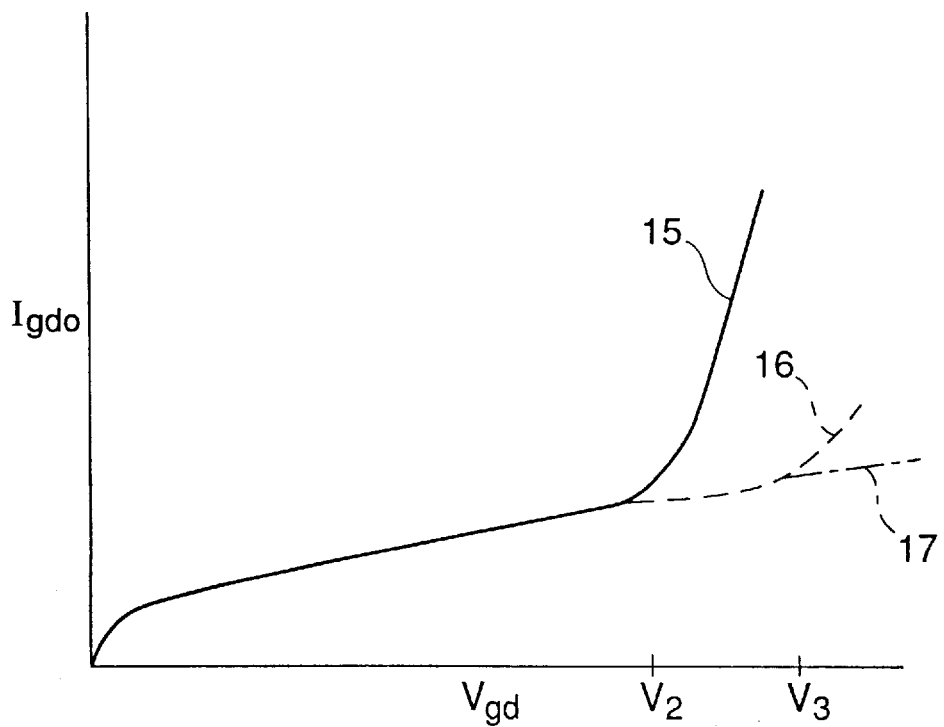
FIG. 4 illustrates gate-drain current-voltage characteristics of the invented and conventional field-effect transistors.

FIG. 4 illustrates the relation between gate-drain voltage ($V_{gd}$), shown on the horizontal axis, and gate-drain reverse current ($I_{gdo}$), shown on the vertical axis, for the transistors of FIGS. 1 and 2 when the source electrode 5 is left open (not connected). Solid line 15 characterizes the conventional transistor. Dotted line 16 characterizes the first embodiment when a control voltage $V_c$ of –3 V is applied to the covering electrode 9. Dash-dot line 17 characterizes the first embodiment when $V_c$ is –10 V. In the conventional transistor, gate-drain breakdown occurs at voltage $V_2$. In the first embodiment, when $V_c$ is –3 V, gate-drain breakdown does not occur until the higher voltage $V_3$ is reached, and the breakdown is less severe. When $V_c$ is –10 V, breakdown does not occur until a still higher voltage (not shown) is reached.

As FIGS. 3 and 4 indicate, the covering electrode 9 in the first embodiment can provide a significant improvement in source-drain and gate-drain breakdown characteristics, with no increase in on-resistance below the breakdown point.

If applying a separate control voltage $V_c$ to the covering electrode 9 is inconvenient, the covering electrode 9 can be internally coupled to the gate electrode 6, as noted above. The improvement in breakdown characteristics will then be limited, but the transistor will not require any extra terminals or leads, and can be controlled in exactly the same way as a conventional field-effect transistor.

In either case, the covering electrode 9 enables the first embodiment to satisfy the conflicting requirements of low on-resistance and very high off-resistance.

Figure 5:
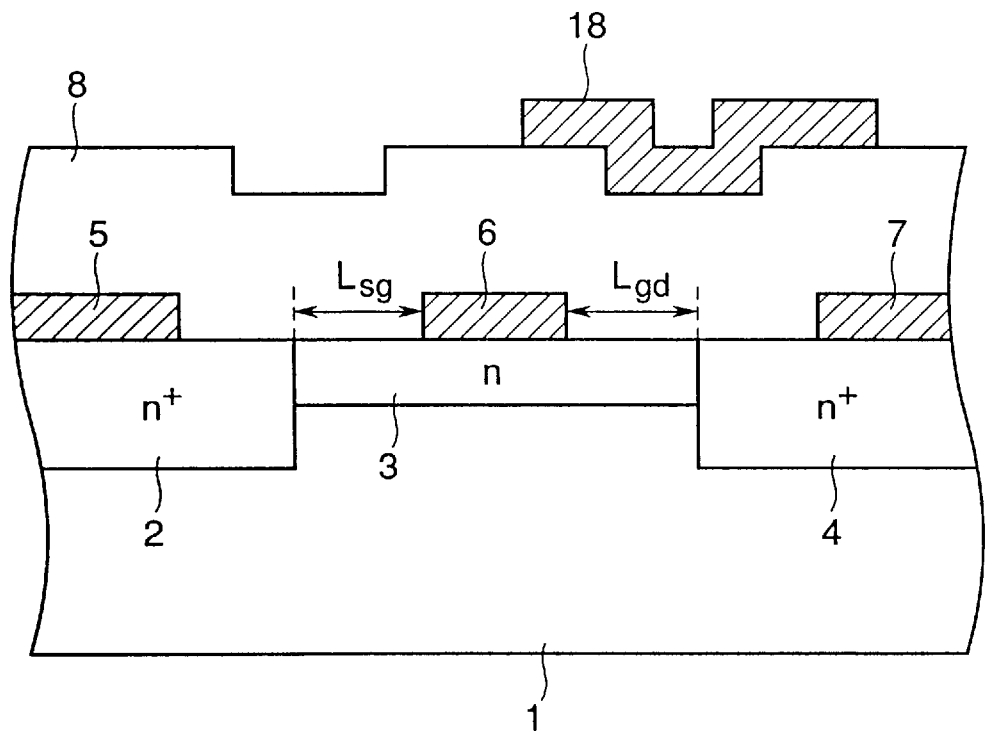
FIG. 5 is a sectional view of a second embodiment of the invented field-effect transistor.

FIG. 5 illustrates a second embodiment of the invented field-effect transistor, using the same reference numerals as in FIG. 1 except for the covering electrode. The difference between the first and second embodiments is that the covering electrode 18 in the second embodiment extends only from a point over the gate electrode 6 to a point over the drain electrode 7, thus overlying only that part of the channel 3 disposed between the gate electrode 6 and drain 4. As in the first embodiment, the covering electrode 18 may be either independently connected to an external control circuit, or internally connected to the gate electrode 6.

In a variation of the second embodiment, the covering electrode 18 covers only part of the area from the gate electrode 6 to the drain electrode 7.

The second embodiment provides improved breakdown characteristics similar to those in the first embodiment. In particular, the same improvement in gate-drain breakdown voltage is achieved as in the first embodiment. In addition, since no part of the covering electrode 18 is disposed directly over the source $n^+$ region 2 or source electrode 5, capacitive coupling between the source and covering electrode is greatly reduced.

In the first embodiment, although the transistor conducts very little direct current in the off-state, alternating current, is weakly coupled from the drain electrode 7 to the source electrode 5, due to unwanted capacitive coupling of the source and drain electrodes 5 and 7 to the covering electrode 9. The second embodiment substantially eliminates one part of this capacitive coupling link, thereby improving the isolation of the source electrode 5 from alternating-currernt waveforms, such as carrier-signal waveforms, that might be applied to the drain electrode 7.

Figure 6:
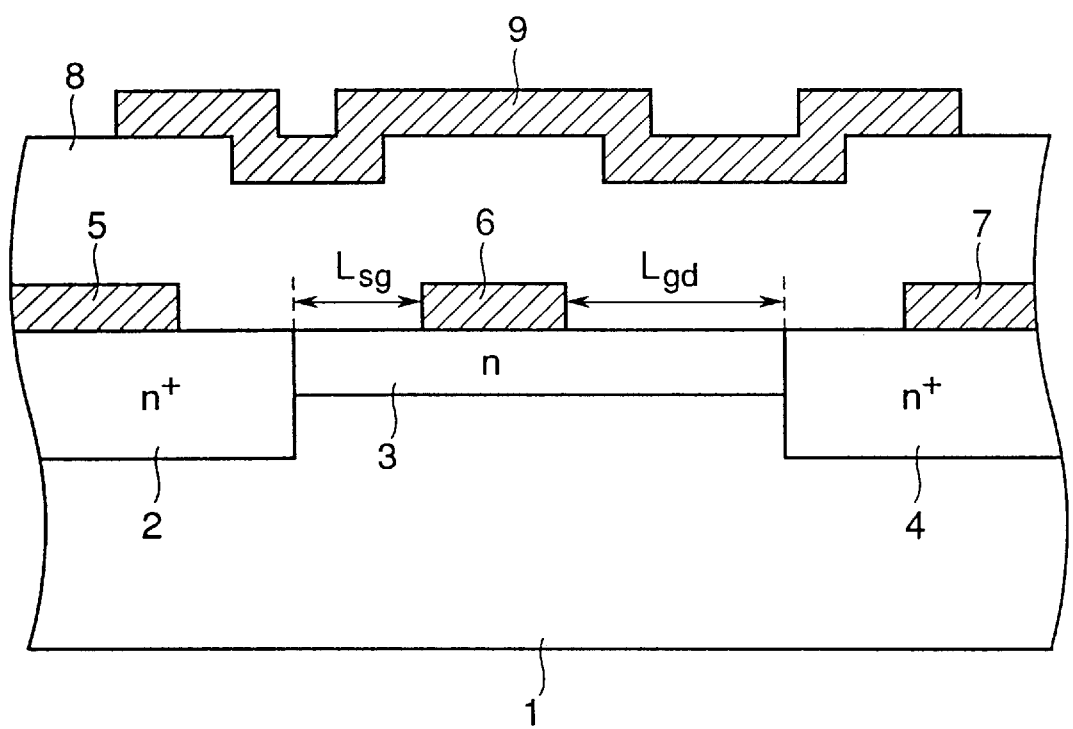
FIG. 6 is a sectional view of a third embodiment of the invented field-effect transistor.

FIG. 6 illustrates a third embodiment, using the same reference numerals as in FIG. 1. The third embodiment is identical to the first embodiment except, that the transistor is asymmetric: the distance $L_{gd}$ from the gate electrode 6 to the drain 4 exceeds the distance $L_{sg}$ from the source 2 to the gate electrode 6. Specifically, $L_{sg}$ is 1 $\mu$m and $L_{gd}$ is 2 $\mu$m. As in the first embodiment, the covering electrode 9 can either receive an independent control voltage $V_c$, or be coupled internally to the gate electrode 6 and receive the gate voltage $V_g$.

The increased distance $L_{gd}$ in the third embodiment increases the length of the channel 3, leading to a somewhat increased on-resistance, but also increases the breakdown voltages in the off-state. Specifically, the doubling of $L_{gd}$ in the third embodiment produces substantially a 33% increase in on-resistance, but a 20% improvement (increase) in the source-drain breakdown voltage, and a 40% improvement (increase) in the gate-drain breakdown voltage.

Figure 7:
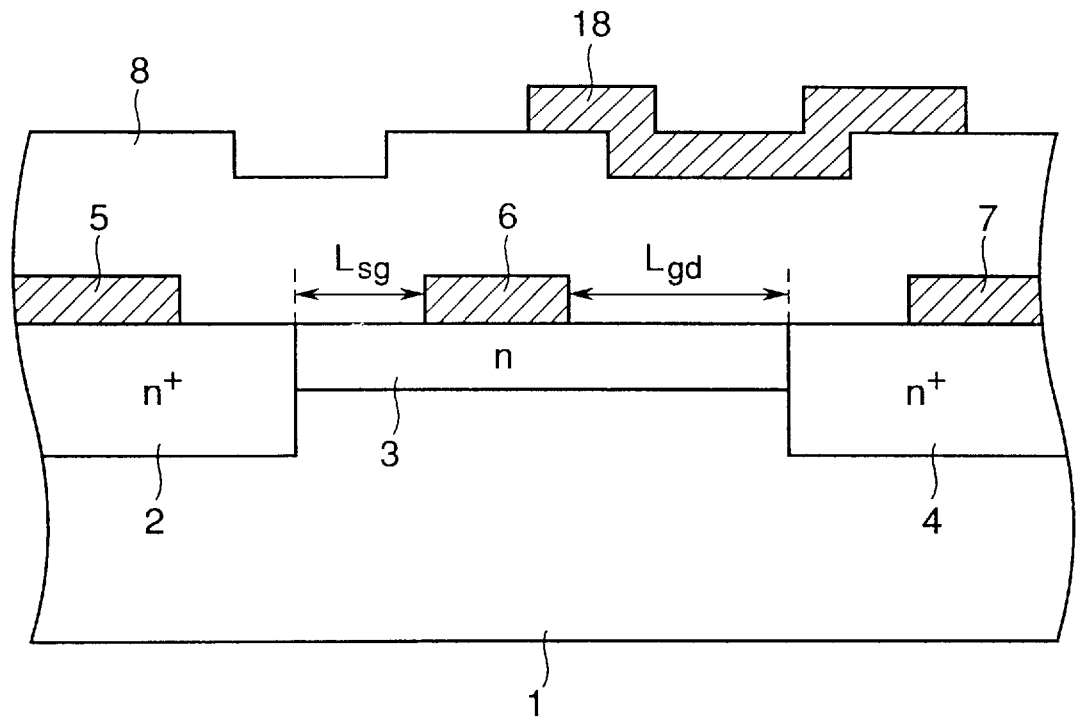
FIG. 7 is a sectional view of a fourth embodiment of the invented field-effect transistor.

FIG. 7 illustrates a fourth embodiment, using the same reference numerals as in FIG. 5. The fourth embodiment is identical to the second embodiment except that, as in the third embodiment, $L_{gd}$ exceeds $L_{sg}$. The fourth embodiment combines the advantages of the second and third embodiments: reduced capacitive coupling between the source and drain, and improved source-drain and gate-drain breakdown characteristics. The fourth embodiment thus provides excellent alternating-current and direct-current isolation performance in the off-state, with only a slightly increased resistance in the on-state.

Next, an embodiment of the invented antenna switch will be described. This embodiment couples an antenna to the transmitting and receiving circuits of a device such as a portable telephone set.

Figure 8:
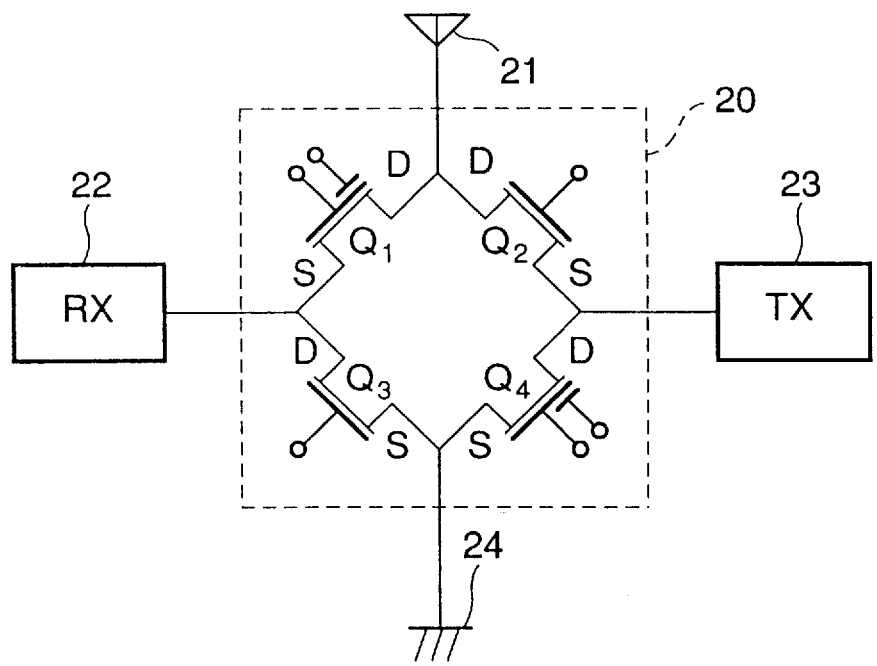
FIG. 8 is a schematic diagram of an embodiment of the invented antenna switch.

Referring to FIG. 8, the antenna switch 20 comprises a bridge network of four field-effect transistors $Q_1$ to $Q_4$. The letters S and D identify the source and drain of each transistor. Transistors $Q_1$ and $Q_4$ have the asymmetric structure of the fourth embodiment. Transistors $Q_2$ and $Q_3$ are conventional symmetric field-effect transistors of the type shown in FIG. 2, without covering electrodes.

The antenna 21 is coupled to the drain electrodes of transistors $Q_1$ and $Q_2$. The receiving circuit (RX) 22 is coupled to the source electrode of transistor $Q_1$ and to the drain electrode of transistor $Q_3$. The transmitting circuit (TX) 23 is coupled to the source electrode of transistor $Q_2$ and to the drain electrode of transistor $Q_4$. The source electrodes of transistors $Q_3$ and $Q_4$ are coupled to a ground terminal 24. The control circuit coupled to the gate and covering electrodes of the transistors has been omitted to avoid obscuring the invention with irrelevant detail.

Figure 9:
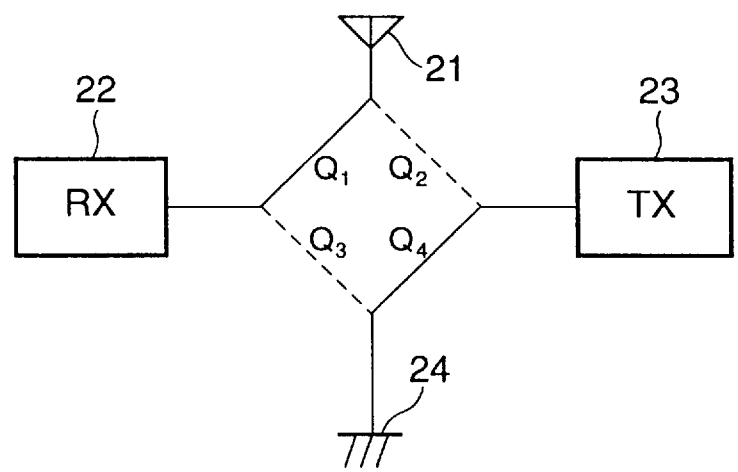
FIG. 9 shows the antenna switch in the receiving state.
Figure 10:
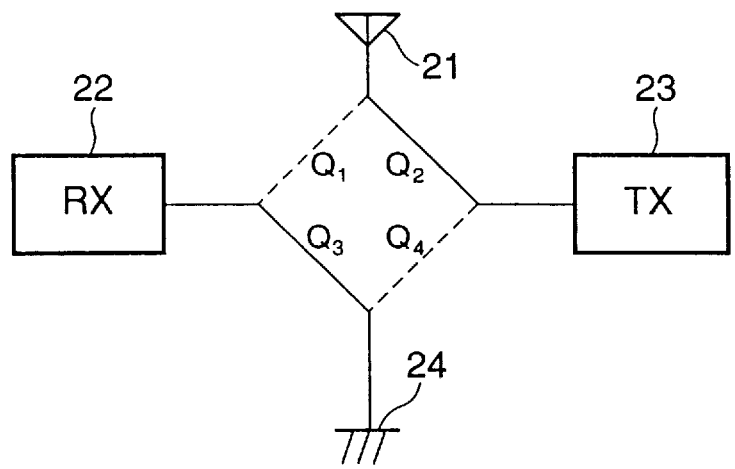
FIG. 10 shows the antenna switch in the transmitting state.

FIGS. 9 and 10 are network diagrams illustrating the operation of the invented antenna switch.

In the receiving state, transistors $Q_1$ and $Q_4$ are switched on, as indicated by solid lines in FIG. 9, while transistors $Q_2$ and $Q_3$ are switched off, as indicated by dashed lines. The slightly increased on-resistance of transistor $Q_1$ presents no problem in this state, because the receiving circuit 22 itself has a much higher input impedance. The slightly increased on-resistance of transistor $Q_4$ presents no problem either, because the transmitting circuit 23 is switched off in the receiving state. The signal received at the antenna 21 is of course a low-voltage signal, so the conventional breakdown characteristics of transistors $Q_2$ and $Q_3$ are adequate to prevent leakage of received signal power to the transmitting circuit 23 or ground terminal 24.

In the transmitting state, transistors $Q_2$ and $Q_3$ are switched on, as indicated by solid lines in FIG. 10, while transistors $Q_1$ and $Q_4$ are switched off, as indicated by dashed lines. The strong, high-frequency carrier signal output by the transmitting circuit 23 is coupled with little loss to the antenna 21, because of the low on-resistance of the conventional transistor $Q_2$. Coupling of this power to the receiving circuit 22 or ground is blocked by the novel transistors $Q_1$ and $Q_4$. Direct-current coupling is blocked because of the high source-drain breakdown voltages of these transistors, while capacitive coupling is blocked because their covering electrodes cover only the area between the gate electrode and drain, substantially eliminating capacitive coupling to the source electrode. Thus very little transmitting power is lost in the antenna switch 20.

In addition, in the transmitting state, the receiving circuit 22 is coupled to the ground terminal 24 through transistor $Q_3$. Since the on-resistance of transistor $Q_3$ is much lower than the input impedance of tile receiving circuit 22, the very small amount of transmitting power that leaks through transistor $Q_1$ is shunted almost entirely to ground; substantially none of the leaking power enters the receiving circuit 22.

By employing both field-effect transistors of the conventional symmetric type and novel transistors of the asymmetric type with covering electrodes, the invented antenna switch 20 is able to combine a low antenna insertion-loss characteristic with excellent isolation of the receiving circuit 22 from the transmitting circuit 23.

The present invention has been described in relation to an antenna switching circuit, but can be practiced in numerous other circuits as well.

The invented field-effect transistors can be applied in any type of circuit requiring enhanced isolation performance, including microwave modulating and demodulating circuits, microwave switches, and inverters that chop direct-current power at microwave frequencies. Very high-frequency operation is possible if the gate length of the transistors is shortened, to raise the cut-off frequency $f_T$.

The circuit configuration of the switch 20 in FIG. 8 is applicable to double-pole double-throw switches in general, and is not limited to antenna switches.

The semiconductor substrate or the invented transistors is not limited to gallium arsenide. Other compound semiconductor materials, such as indium-phosphide (InP) and indium-gallium-arsenide (InGaAs), can be used. (InP and InGaAs have excellent high-frequency characteristics.) The invention can also be practiced with a silicon semiconductor substrate, and with p-channel transistors instead of n-channel transistors.

Those skilled in the art will recognize that other variations are possible within the scope claimed below.

What is claimed is:

1. A field-effect transistor having a semiconductor substrate, a source and a drain formed in the semiconductor substrate, a channel for conducting current in the semiconductor substrate between the source and the drain, a gate electrode formed on the semiconductor substrate adjacent part of the channel for controlling said current, and an insulating layer covering the semiconductor substrate and the gate electrode, said field-effect transistor further comprising:

a covering electrode formed on said insulating layer, isolated by said insulating layer from said source and said drain, overlying at least part of said channel, for receiving a first voltage when said field-effect transistor is switched on and a second voltage when said field-effect transistor is switched off, said second voltage creating an electric field that hinders current flow in said channel.

2. The field-effect transistor of claim 1, wherein said gate electrode receives at least one voltage which is different from said first and second voltages.

3. The field-effect transistor of claim 1, wherein said covering electrode is coupled to said gate electrode.

4. The field-effect transistor of claim 1, wherein said source and said drain are equidistant from said gate electrode.

5. The field-effect transistor of claim 4, wherein said covering electrode overlies all of said channel.

6. The field-effect transistor of claim 4, wherein said covering electrode overlies at least part of said channel disposed between said gate electrode and said drain, and does not overlie any part of said channel disposed between said source and said gate electrode.

7. The field-effect transistor or claim 1, wherein said gate electrode is farther from said drain than from said source.

8. The field-effect transistor of claim 7, wherein said covering electrode overlies all of said channel.

9. The field-effect transistor of claim 7, wherein said covering electrode overlies at least part of said channel disposed between said gate electrode and said drain, and does not overlie any part of said channel disposed between said source and said gate electrode.

10. An antenna switching circuit having a first field-effect transistor coupling an antenna to a receiving circuit, and a second field-effect transistor coupling said antenna to a transmitting circuit, wherein said first field-effect transistor comprises:

a semiconductor substrate with a source coupled to said receiving circuit, a drain coupled to said antenna, and a channel for conducting current between said source and said drain;

a gate electrode formed on said semiconductor substrate, covering part of said channel, for controlling said current;

an insulating layer formed on said semiconductor substrate, covering said semiconductor substrate and said gate electrode; and a covering electrode formed on said insulating layer, isolated by said insulating layer from said source, said drain and said channel, overlying at least part of said channel between said gate electrode and said drain, for receiving a first voltage when said field-effect transistor is switched on and a second voltage when said field-effect transistor is switched off, said second voltage creating an electric field that hinders current flow in said channel.

11. The antenna switching circuit of claim 10 wherein, in said first field-effect transistor, said gate electrode is farther from said drain than from said source.

12. The antenna switching circuit of claim 10 wherein, in said first field-effect transistor, said covering electrode does not overlie any part of said channel between said source and said gate electrode.

13. The antenna switching circuit of claim 10, wherein said second field-effect transistor is symmetric.

14. The antenna switching circuit of claim 10, also comprising:

a ground terminal;

a third field-effect transistor coupling said receiving circuit to said ground terminal, said third field-effect transistor being switched on and off simultaneously with said second field-effect transistor; and a fourth field-effect transistor coupling said transmitting circuit to said ground terminal, said fourth field-effect transistor being switched on and off simultaneously with said first field-effect transistor.

15. The antenna switching circuit of claim 14, wherein said third field-effect transistor is symmetric.

16. The antenna switching circuit of claim 14, wherein said fourth field-effect transistor has a covering electrode similar to the covering electrode of said first field-effect transistor.

* * * * *